United States Patent [19]

Whitehouse

[11] 4,347,263

[45] Aug. 31, 1982

[54] METHOD OF APPLYING AN ANTIREFLECTIVE AND/OR DIELECTRIC COATING

[75] Inventor: Daniel L. Whitehouse, Clarksburg, Md.

[73] Assignee: Solarex Corporation, Rockville, Md.

[21] Appl. No.: 257,250

[22] Filed: Apr. 24, 1981

Related U.S. Application Data

[63] Continuation-in-part of Ser. No. 154,770, May 30, 1980, abandoned.

[51] Int. Cl.$^3$ ............................................. B05D 1/34
[52] U.S. Cl. ................................... 427/74; 427/160; 427/164; 427/255.3
[58] Field of Search ............... 427/74, 160, 162, 255.3

[56] References Cited

U.S. PATENT DOCUMENTS 3,533,850 10/1970 Tarneja et al. ............... 350/164 X
3,922,774 12/1975 Lindmayer et al. ............ 148/6.3 X
4,156,622 5/1979 Lindmayer ..................... 427/162 X

*Primary Examiner*—James R. Hoffman
*Attorney, Agent, or Firm*—Watson, Cole, Grindle & Watson

[57] ABSTRACT

A method of applying an antireflective and/or dielectric coating for solar energy cells by directing from different sources (1) a vapor comprising a metal halide or metal alkoxide and (2) oxygen to the heated surface of a silicon wafer. The metal is deposited on the silicon in the form of an oxide.

10 Claims, No Drawings

METHOD OF APPLYING AN ANTIREFLECTIVE AND/OR DIELECTRIC COATING

This is a continuation-in-part of Ser. No. 154,770, filed May 30, 1980, and now abandoned.

The present invention relates to a method of applying an antireflective and/or dielectric coating to a photovoltaic cell, which coating has as its purpose mitigation of reflection of useful light directed against the light-receiving surface of the cell.

Semiconductor devices may be formed from crystalline silicon in which the silicon, often in the form of a wafer, has been doped with a certain type of impurity causing the silicon wafer to adopt a specific polarity. According to the impurity introduced, the silicon becomes either a p-type or an n-type material. If a dopant such as boron is used, the silicon wafer will be p-type, whereas the use of a dopant such as phosphorus yields n-type silicon. A junction is then formed by diffusing into the wafer an impurity of the conductivity type opposite to that with which the wafer has previously been doped.

A p-n junction having been established, radiant energy, usually in the form of light impinging on the surface, is rapidly absorbed at it penetrates the semiconductor material, generating free electrons and holes in pair. The minority carriers of the hole-electron pairs, in the region of their generation, either recombine with the majority carriers or cross the p-n junction. The minority carriers that cross the p-n junction cause the body to become biased, the electrons being attracted to the n-type region and the holes into the p-type region. This bias results in a useful electrical current which flows when the two regions are connected externally by an electrical conductor. The external connections are usually made to conductors that ordinarily take the form of a metallic grid positioned on that surface of the cell that is to be exposed to light, and a metallic contact on the other, back surface of the wafer.

An important criterion in obtaining maximum cell efficiency, i.e., the power output measured as a percent of the power input, is that there be maximum absorption of light energy under any given condition of light availability. The efficiency of the solar cell is limited, however, by a known optical phenomena whereby some of the light, both useful and non-useful, striking the front, light-receiving surface of the solar cell is partially reflected from the cell. To reduce the problem of light reflection it is a general practice to employ an antireflective coating positioned on the surface of the solar cell through which the light enters.

To function properly the antireflective coating must possess, among other things, certain optical properties. With respect to one of its optical properties, the antireflective coating should reduce reflection of useful light. In applications where a cover is placed over the antireflective coating to prevent damage to the solar cell, such as a quartz cover slide in space application, and a transparent encapsulant in certain terrestrial applications, the index of refraction of the antireflective coating should be between that of the cover material and the underlying cell. This reduces the amount of light that is reflected. Further, the antireflective coating should not absorb useful light, but should enable the passage of such light to the underlying solar cell. The use of a particular antireflective material is, therefore, dependent on the reflective index of the underlying solar cell and the cover material, as well as the absorption band wavelengths of the solar cell.

In the U.S. Pat. No. 3,922,774 to Lindmayer et al., a process for forming an antireflective coating on a wafer was disclosed in which tantalum metal was evaporated by means of an electron beam and then thermally or anodically oxidized on the wafer to tantalum pentoxide.

In U.S. Pat. No. 3,533,850 to Tarneja et al., a method is disclosed for applying antireflective material, e.g., $Ta_2O_5$, by evaporating the tantalum pentoxide directly onto the light impinging surface of the solar cell. The coating produced by this method however, has an index of refraction that is much lower than the desired value.

A difficulty has also been experienced in the production of antireflective coatings on solar cells utilizing the method described in U.S. Pat. No. 3,922,774. The difficulty is in controlling the thickness of the tantalum pentoxide layer formed from the deposited elemental tantalum, although the method has been successfully utilized.

In a method disclosed in U.S. Pat. No. 4,156,622 to Lindmayer, an antireflective coating of tantalum pentoxide is produced by electron beam evaporation of a mixture of elemental tantalum and a tantalum suboxide, followed by oxidation of the deposited layer to tantalum pentoxide. To a limited extent this method has the same difficulty in controlling the thickness of the coating, as well as high energy requirements for deposition and the need for a high vacuum during the process.

According to the present invention, a means has been developed for the deposition of an antireflective and/or dielectric coating on a substrate by chemical vapor deposition. The present method eliminates disadvantages f the prior art methods of metal deposition. In addition, this invention offers the advantages of being easier to control and requiring relatively less energy for deposition. An additional advantage offered by my invention is that the process, unlike most other processes that require high vacuums, may be carried out at atmospheric pressure.

In the process of this invention, a metal halide or alkoxide is heated to its vapor state, and as the vapor comes in contact with oxygen in close proximity to or at the surface of a heated substrate, an oxide is formed and deposited on the substrate. The coating so formed requires no further heat treatment to convert it to a hard, high reflective index, optical quality, and chemically stable coating.

The metal ion for use in this invention is one that is recognized in oxide form as having utility as an antireflective coating. Generally, it is contemplated as being selected from the group consisting of tantalum, niobium, titanium, cerium, tin, zirconium, yttrium and hafnium. The halide ion is selected from the group consisting of chloride, bromide or iodide and the alkoxide has preferably 1 to 6 carbon atoms, such as methoxides, ethoxides, propoxides, isopropoxides, pentoxides and hexoxides.

In the preferred process of this invention, a metal chloride selected from the group consisting of tantalum chloride, niobium chloride, titanium tetrachloride, zirconium chloride, yttrium chloride and hafnium chloride is heated to its vapor phase. The vapor is then transported, by itself or mixed with a transport gas, through conventional apparatus, to a dispensing nozzle which is directed at the light-impinging surface of a heated silicon substrate. At the same time that the metal chloride vapor comes in contact with the substrate, which is preferably silicon, the substrate is also contacted with a stream of oxygen. This procedure oxidizes the metal chloride to its oxide and deposits the oxide on the substrate.

The metal compound vapors may be combined with a transport gas to assist in transporting the vapor to the reaction area and also to control the character of the gaseous medium in the reaction area. The transport gas may be an inert gas, such as nitrogen, or may be somewhat reducing in nature, such as forming gas, or a mixture of methanol and nitrogen. Basically, the transport gas is non-oxidizing and tends to mitigate premature oxidation of the vapor, that is, other than on the surface of the silicon wafer. When used, it is protective of the metal compound vapor and of apparatus and persons in the vicinity of the vapor.

The stoichiometry of the oxide layer deposited on the silicon substrate is controlled by the composition of the atmosphere in the reaction area, i.e., the concentration of metal compound, oxygen and gaseous medium and the reaction temperature. The temperature of the reaction area, e.g., the temperature to which the silicon substrate is heated, is above approximately 325° C. and preferably in the approximate range of 325° C. to 450° C.

Ideally the metal oxide deposited on the silicon substrate will approach its highest stable oxidative state, which is the pentoxide for tantalum and niobium; $MO_2$ for titanium, hafnium and zirconium; and $Y_2O_3$ for yttrium. The higher the temperature at the reaction area and the higher the ratio of oxygen to metal compound, the closer the product will be to its stoichiometric composition.

The thickness of the coating can be determined by the various known instruments available for that purpose. The thickness of the coating may vary, but preferably is approximately one-quarter wavelength of light energy having a wavelength in the range of about 0.5 to 0.75 micron. For tantalum pentoxide this thickness is in the range of about 550 A° to about 650 A°. The thickness for the other metal oxides is also in this general range, but may vary slightly at either end of the range.

Although the invention has been shown in connection with certain embodiments, it will be readily apparent to those skilled in the art that various changes may be made without departing from the spirit of the invention. As to all such changes, I desire to include them within the purview of the invention, which is to be limited only by the scope, including equivalents, of the following, appended claims.

I claim:

1. A method of applying an antireflective coating to the surface of a photovoltaic cell, said surface being adapted to absorb light impinging thereon, comprising heating said surface to a temperature above approximately 325° C., and directing to said surface from separate sources (a) a vapor comprising a metal compound selected from the group consisting of a metal halide or metal alkoxide, and (b) oxygen, so that an antireflective layer of the respective oxide is deposited on said surface.

2. A method as claimed in claim 1, in which said metal compound is a metal halide.

3. A method as claimed in claim 2, in which said metal halide is selected from the group consisting of tantalum chloride, niobium chloride, titanium tetrachloride, zirconium chloride, yttrium chloride and hafnium chloride.

4. A method as claimed in claim 1, in which said photovoltaic cell is formed from silicon.

5. A method as claimed in claim 1, in which said wafer is heated to a temperature in the range of approximately 325° C. to 450° C.

6. A method as claimed in claim 1, in which the metal compound vapor is mixed with a transport gas.

7. A method as claimed in claim 6, in which said transport gas is an inert gas.

8. A method as claimed in claim 7, in which said inert gas is nitrogen.

9. A method as claimed in claim 6, in which said transport gas is a reducing gas.

10. A method as claimed in claim 9, in which said reducing gas is selected from the group consisting of forming gas, and methanol and nitrogen.

* * * * *